(12) United States Patent
Wendelrup et al.

(10) Patent No.: US 6,211,647 B1
(45) Date of Patent: Apr. 3, 2001

(54) METHOD ENABLING COMMUNICATIONS BETWEEN AN ELECTRONIC DEVICE AND A BATTERY, AN APPARATUS COMPRISING AN ELECTRONIC DEVICE AND A BATTERY, AND A BATTERY ENABLING COMMUNICATION

(75) Inventors: Heino Wendelrup, Malmö; Michael Kellerman, Akarp; Johan Mercke; Kristoffer Ptasinski, both of Lund; Jan Rubbmark, Malmo; Jonas Bengtsson, Lund; Charles Forsberg, Skurup, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/489,823

(22) Filed: Jan. 24, 2000

(30) Foreign Application Priority Data

Jan. 27, 1999 (SE) .................................... 9900304

(51) Int. Cl.⁷ ...................................................... H02J 7/00
(52) U.S. Cl. ............................................. 320/112; 340/634
(58) Field of Search ............................ 320/106; 340/346, 340/426, 395, 692

(56) References Cited

U.S. PATENT DOCUMENTS

| | | | |
|---|---|---|---|
| 4,709,202 | * 11/1987 | Koenck et al. | 320/112 |
| 5,159,684 | 10/1992 | Kroll et al. | 710/104 |
| 5,541,489 | 7/1996 | Dunstan | 320/134 |
| 5,659,299 | * 8/1997 | Williamson et al. | 340/825.57 |
| 5,796,239 | 8/1998 | van Phuoc et al. | 320/107 |
| 6,085,576 | * 3/1999 | Sunshine et al. | 340/634 |

* cited by examiner

Primary Examiner—Peter S. Wong
Assistant Examiner—Pia Tibbits
(74) Attorney, Agent, or Firm—Nixon & Vanderhye, P.C.

(57) ABSTRACT

A method enables digital, serial communication over an interface between an electronic device (102) and a battery (103) attached thereto. The digital, serial communication comprises transmission of bytes (300) consisting of a number of bits. The method comprises the steps of transmitting a byte from a first one of said electronic device and said battery, receiving said byte in the other of said electronic device and said battery, and retransmitting said received byte unchanged. Hereby, it is possible to compare the contents of the returned byte with the contents of the byte originally transmitted, and thus ensure that the byte was transmitted correctly. This simple procedure makes other error handling procedures such as parity bits unnecessary.

10 Claims, 3 Drawing Sheets

Figure 1:
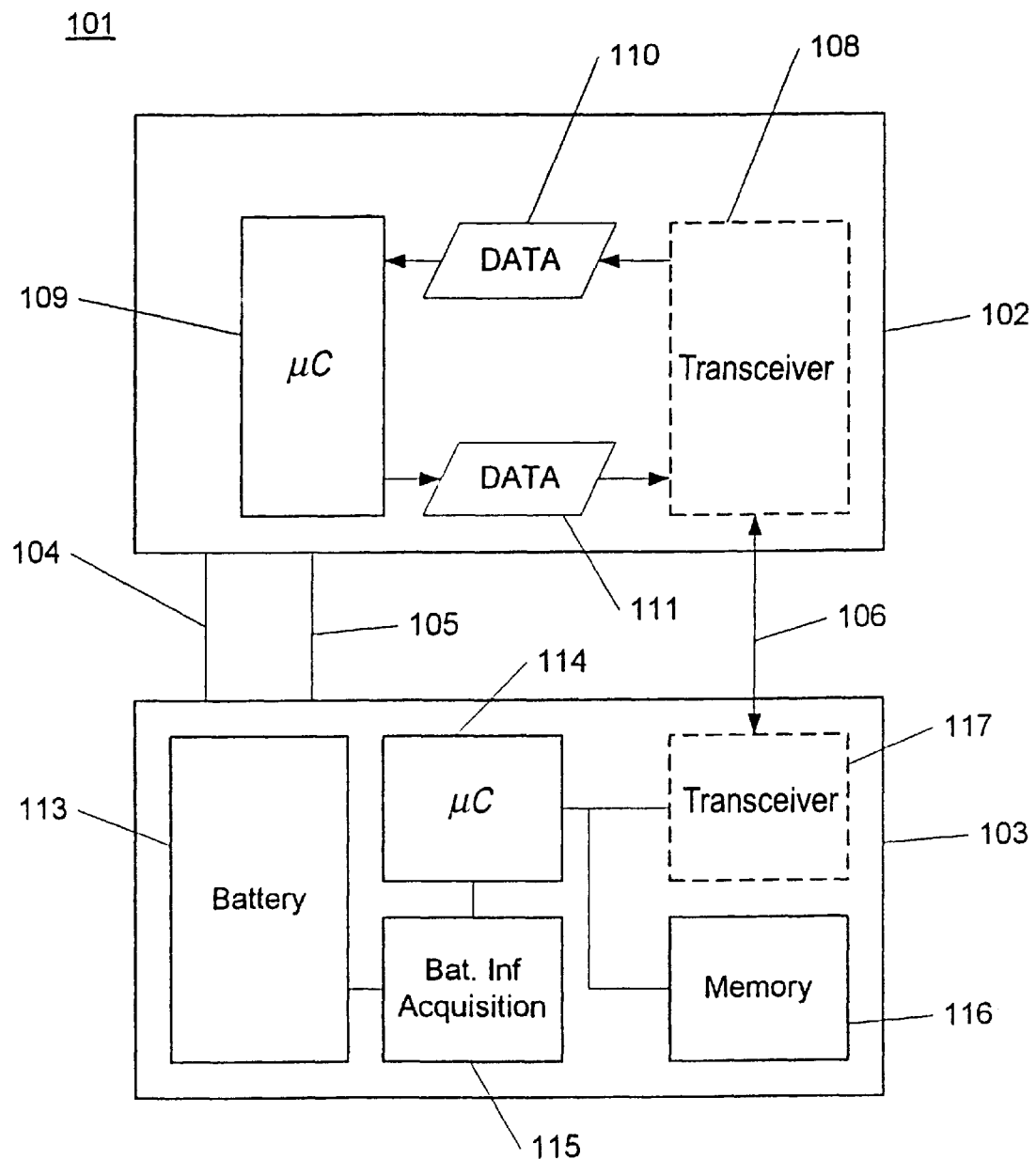

METHOD ENABLING COMMUNICATIONS BETWEEN AN ELECTRONIC DEVICE AND A BATTERY, AN APPARATUS COMPRISING AN ELECTRONIC DEVICE AND A BATTERY, AND A BATTERY ENABLING COMMUNICATION

The invention relates to a method enabling digital, serial communication over an interface between an electronic device and a battery attached thereto, said digital, serial communication comprising transmission of bytes consisting of a number of bits. Further, the invention relates to an apparatus comprising an electronic device and a battery attached thereto, and to a battery.

In recent years the cellular telephone technology has developed rapidly and thus created a similar need for development in the area of batteries and battery packs, and more specifically, for communicating between a battery and an electronic device, such as a cellular telephone. Cellular telephones must utilize batteries in order to provide mobile capabilities. The battery is critical to the user of a cellular telephone, since the battery provides the ability to move about freely without being tied to a stationary power source.

Thus, in order to maximize the use of a cellular telephone, and other portable electronic devices, it is important that a user achieves maximum performance from the attached battery. This may be achieved by correctly charging the battery and always being able to identify the exact charging status of the battery. This enables the user to know how much standby time is left on the phone. This type of information enables the user to intelligently whether if the charge in a battery is sufficient for his needs, or whether charging of the battery is required.

Recent developments of battery and battery pack related technologies have provided users with so-called "smart" batteries which can provide a user with a power source for an electronic device and further provide data transmission capabilities between the battery and the attached electronic device. This type of batteries may include storage means containing various data representing information which may be presented to a user, e.g. in a display of the portable device. The information in a battery may include an identification number, the maximum capacity, the present capacity, etc.

Some information from the battery is only used internally in the portable electronic device, while other information from the battery can be presented to the user, e.g. after having been processed by a processor in the battery or in the portable electrical device. For example, the stored information about the maximum capacity of the battery can be used in the electronic device only, while the current capacity may be calculated by the electronic device using the maximum capacity (or a previous value of the current capacity) and knowledge about the power consumption of the electronic device.

Therefore, information is exchanged between the electronic device and the battery by means of e.g. digital, serial communication over an interface between an electronic device and a battery attached thereto.

Such communication also needs some sort of error handling in order to ensure that the exchanged information is correct. Many error handling procedures are known from the computer technology. However, these techniques, while satisfactory in a computer environment, are too complex and expensive for use with smaller and cheaper electronic devices, such as a cellular telephone.

Therefore, it is an object of the invention to provide a method of the above-mentioned type which can overcome the described limitations, i.e. a method that is simple and cheap to implement.

In accordance with the invention, this object is accomplished in that the method comprises the steps of transmitting a byte from a first one of said electronic device and said battery, receiving said byte in the other of said electronic device and said battery, and retransmitting said received byte unchanged.

When a byte transmitted from a sending party to a receiving party is just returned or echoed unchanged to the sending party, it is possible for this party (which could be either the electronic device or the battery) to compare the contents of the returned byte with the contents of the byte originally transmitted, and thus ensure that the byte was transmitted correctly. This simple procedure makes other error handling procedures such as parity bits unnecessary.

As stated in claim 2, the step of retransmitting may further comprise the steps of receiving a byte from said interface, storing the received byte in a non-volatile memory, retrieving the stored byte from said non-volatile memory, and transmitting the retrieved byte via said interface. In this way, not only the transmission over the interface, but also the transfer to the non-volatile memory is checked.

As stated in claim 3, the method may further comprise the steps of receiving in the first one of said electronic device and said battery the retransmitted byte, comparing the contents of the received retransmitted byte to the contents of the byte that was previously transmitted, detecting a transmission error, if the contents of the two bytes do not coincide. This enables a simple error detection.

As mentioned, the invention further relates to an apparatus comprising an electronic device, a battery attached thereto, and means enabling digital, serial communication over an interface between the electronic device and the battery, and comprising first communications circuitry in the electronic device and second communications circuitry in the battery, said digital, serial communication comprising transmission between said first and second communications circuitry of bytes consisting of a number of bits.

When at least one of said first and second communications circuitry is adapted to retransmit a received byte unchanged, an apparatus of the above-mentioned type which can overcome the described limitations is provided, i.e. an apparatus that is simple and cheap to implement.

Expedient embodiments of the apparatus are described in claims 5 and 6 having the benefits mentioned above. Further, as stated in claim 7, the electronic device may expediently be a cellular telephone.

As mentioned, the invention further relates to a battery comprising means enabling digital, serial communication over an interface between the battery and an electronic device, and comprising communications circuitry in the battery, said digital, serial communication comprising transmission between said communications circuitry and the electronic device of bytes consisting of a number of bits.

When said communications circuitry is adapted to retransmit a received byte unchanged, a battery of the above-mentioned type which can overcome the described limitations is provided, i.e. a battery that is simple and cheap to implement.

Expedient embodiments of the battery are described in claims 9 and 10 having the benefits mentioned above.

Figure 2:
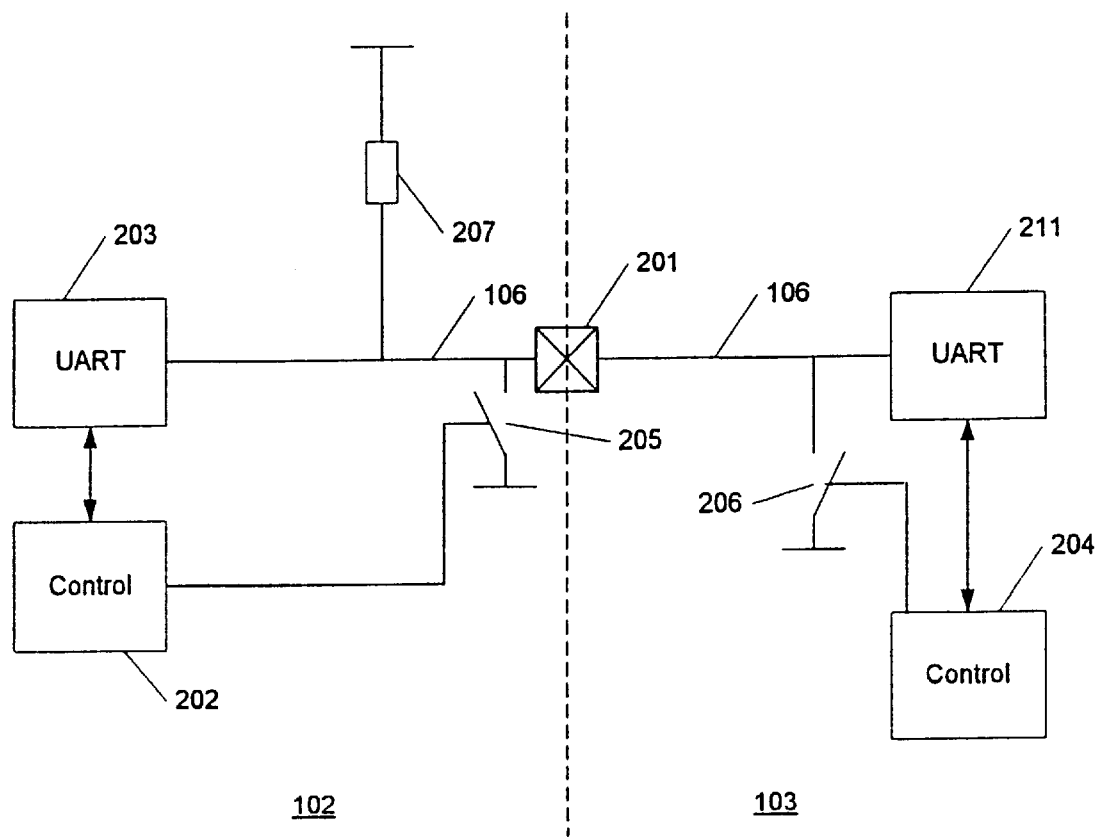
Figure 3:
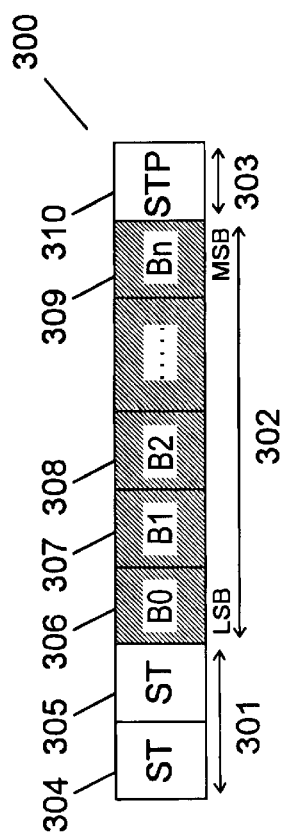
Figure 4:
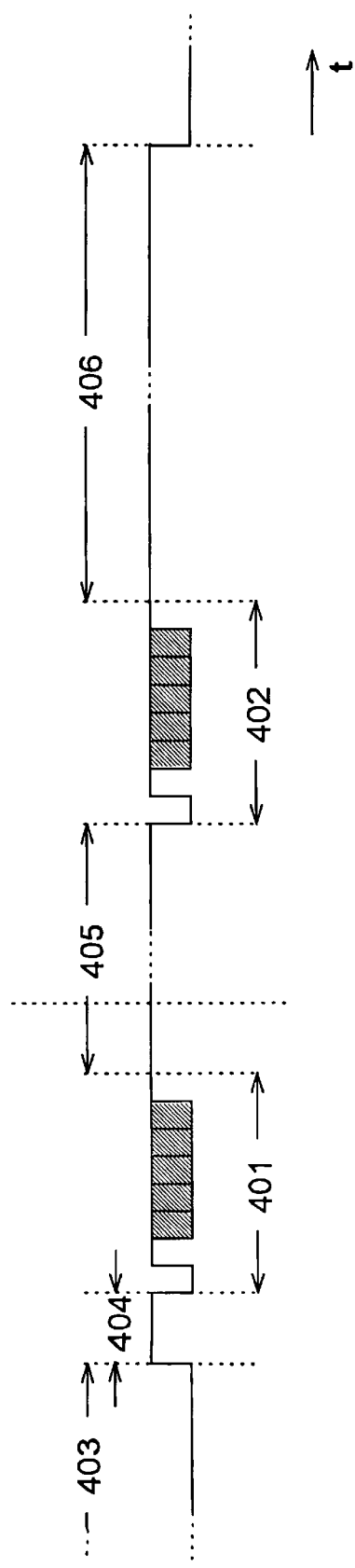

The invention will now be described more fully below with reference to the drawing, in which FIG. 1 shows an apparatus according to the invention, FIG. 2 illustrates a part of an electronic device interfacing with a part of the battery, FIG. 3 is an example of a byte to be used in relation to the above-mentioned transmission, and FIG. 4 illustrates the transmission of bytes.

FIG. 1 shows an apparatus 101 comprising an electronic device 102 and a battery or battery pack 103 attached thereto. The apparatus 101 further comprises a number of connections 104, 105, 106 connecting the electronic device 102 and the battery 103 and thus allowing communication between the electronic device 102 and the battery 103.

The electronic device 102 comprises a transceiver 108, which is also called the first communications means in the following, and a micro-controller 109. The transceiver 108 and the micro-controller 109 are adapted to exchange data, which is illustrated by means of the numerals 110 and 111 in the figure. The micro-controller 109 can transmit information to the transceiver 108 by means of the connection 111. Likewise the connection 110 can be used to transmit data from the transceiver 108 to the micro-controller 109. The transceiver 108 may be a universal asynchronous receiver transmitter (UART).

The battery includes one or more battery cells 113, a micro-controller 114 (which may be a state machine), a battery information acquisition unit 115, a transceiver 117 and a memory 116. It is noted that the transceiver 117 is also called the second communications means in the following. Also the transceiver 117 may be a universal asynchronous receiver transmitter (UART).

The connections 104 and 105 are used to supply power from the battery 103 to the electronic device 102. For example, the connector 104 may be connected to the positive pole of the battery cells 113 in the battery 103, and the connector 105 may be connected to a battery negative pole (GND) of the battery cells 113 in the battery 103.

The transceiver 108 included in the electronic device 102 is connected to the transceiver 117 in the battery 103 by means of the connection 106 enabling digital, serial communication comprising transmission of bytes consisting of a number of bits between the first and the second communications means. The memory 116 is adapted to store a number of data information, for example an identification number of the battery, the maximum capacity of the battery, the current capacity of the battery, etc.

The micro-controller 114 is connected to the transceiver 117, to the battery information acquisition unit 115, and to the memory 116. The battery information acquisition unit 115 is connected to the battery cells 113 and is adapted to retrieve battery information, such as the current battery capacity, etc. from the battery cells 113. The battery information acquisition unit 115 is adapted to transmit the information to the micro-controller 114 when instructed to do so by the micro-controller 114. The micro-controller 114 is adapted to store and retrieve the information from the memory 116 and to transmit the information to the electronic device 102 by means of the transceiver 117.

FIG. 2 illustrates a part of the electronic device 102 interfacing with a part of the battery 103 and shows the connection 106 adapted to connect the electronic device 102 and the battery 103 in relation to the connection 106 shown in FIG. 1. The left side of FIG. 2 illustrates a part of the electronic device 102 while the right side of FIG. 2 illustrates a part of the battery 103. As shown in the figure, the electronic device 102 and the battery 103 are connected by means of an interface 201.

The electronic device 102 includes a control unit 202 and a Universal Asynchronous Receiver Transmitter unit 203, i.e. a so-called UART. Likewise, the battery 103 includes a control unit 204. The electronic device 102 and the battery 103 are adapted to transmit data via the interface 201. The transmission is performed by means of a pull-up resistor 207, a switch 205, and a switch 206. The switch 205 in the electronic device is connected to be controlled by the control unit 202. Likewise, the switch 206 in the battery 103 is connected to be controlled by the control unit 204.

The switch 205 and the switch 206 are both connected to ground potential. This enables the control units 202, 204 to transmit information over the interface 201 in turn. The transmission of information from the electronic device 102 to the battery 103 is controlled by the control unit 202. The control unit 202 is adapted to control the switch 205 and hereby send the information to the battery 103. For example, when the switch 205 is open, the pull-up resistor 207 pulls the potential at the communications line 106 to a high level. On the other hand, when the switch is closed, the potential at the communications line 106 is at a low level. Hereby, by controlling the position of the switch 205 the control unit 202 controls the potential at the communications line 106, and as the communication line is connected to the battery 103 information can be transmitted from the electrical device 102 to the battery 103.

Likewise, the control unit 204 can transmit information from the battery 103 to the electronic device 102 by means of the switch 206. The data generated by the switch 205 in the electronic device 102 are received in a UART 211 which can be similar to the UART 203 in the electronic device 102.

In a preferred embodiment, bytes including a number of bits are transmitted between the electronic device 102 and the battery 103. The format of these bytes is illustrated in FIG. 3.

FIG. 3 shows an example of a byte consisting of a number of bits which can be used in relation to the above-mentioned transmission. The byte 300 is divided into three sections: a first section 301 including two start bits, a second section 302 including a number of data bits, and a third section 303 including a stop bit.

The first section 301 includes two start bits 304, 305 and is used to indicate the start of the byte 300 during transmission. Preferably, the start bits have different values, e.g. the start bit 304 is a logic "0" while the start bit 305 is a logic "1". The second section 302 includes a number of data bits (for example eight) having values depending on the information being transmitted. The third section 303 includes a stop bit used to indicate the end of the byte. As will become clear from the following, the stop bit is often not necessary, e.g. when the transmitted bytes are separated by periods having a signal level corresponding to the value of the stop bits, or when bytes transmitted have a fixed length.

FIG. 4 is a timing diagram illustrating the transmission of bytes over the communications line 106 between the electronic device 102 and the battery 103. Note that the time is increasing from the left to the right in the figure.

The figure shows a first byte 401 being transmitted from electronic device 102 to the battery 103 via the communications line 106 followed by a second byte 402 being transmitted in the reverse direction via the communications line 106, i.e. from the battery 103 to the electronic device 102.

The time intervals illustrating the transmission of the first byte and the transmission of the second byte are separated by a time interval indicated by 405 in the figure. The duration of the time interval 405 is specified by the required response time and minimum set-up time for reversing the direction of communication.

One or more of the electronic means in the battery, e.g. the micro-processor 114 can be in an active state or in a power saving state. In the power saving state the communications line is in a so-called idle state. Hereby, the power consumption of these electronic means can be reduced during periods when no bytes are transmitted between the electronic device 102 and the battery 103.

Prior to the transmission of the first byte the transmission line is in idle state in which the signal level on the transmission line equals a level of logic "0". In the figure the idle period situation is indicated by the numeral 403. The control unit 202 brings the transmission line into an so-called active state by bringing the signal level on the transmission line 106 to a high level, as indicated by the period 404 in the figure. The period 404 is a so-called wake-up period in which one or more of the electronic means in the battery are brought from a power saving state to a normal power consumption state.

As illustrated to the right in the figure, the byte 402 is followed by a an interval 406 in which the signal level at the transmission line 106 equals a level of logic "1", i.e. a situation similar to the situation indicated by the interval 405. The minimum duration of the time interval 406 is specified by the required response time and minimum set-up time for reversing the direction of communication. The interval 406 is followed by a shift from the level of logic "1" to a level of logic "0" indicating a situation in which the transmission line 106 is brought into an idle state. Alternatively, the shift could be indicating the start of a new byte being transmitted, i.e. the shift corresponds to the beginning of a new start bit. It is noted that the transmission line can be brought into an idle state when the duration of the time interval 406 exceeds a given predefined value.

The bytes transmitted via the transmission line 106 can include instructions as well as data. The instructions may include so-called read-only instructions sent by the electronic device 102 and instructing the battery 103 to read specified information from the memory 116 and send the information as one or more data bytes in response. For example, the read-only instruction may instruct the battery to send information on the nominal capacity or the battery serial number. The instruction may also include so-called read/write instructions. For example instructions causing reading or writing the presently remaining capacity of the battery. Further, the instruction set may include instructions causing sending and receiving information of the battery communications bus revision, and causing reading and writing of a dynamic identification number.

The revision information specifies the communications bus revision supported. After exchanging the revision number of the battery communications bus, the micro-controllers 109, 114 can use a common communications standard supported by both the electronic device 102 and the battery 103. Hereby, communication between an electronic device 102 and a battery can be obtained even if one of those only supports a later communications standard than the other.

The dynamic identification number is used for communication purposes. The electronic device 102 is adapted to store a given dynamic identification number in both the memory 116 of the battery 103 and in a memory of the electronic device 102. The dynamic identification number may be stored when a battery 103 is connected to the electronic device 102 but can also be stored at an arbitrary time, provided the battery 103 is connected to the electronic device 102.

When the battery is connected to the electronic device 102 the dynamic identification number is transmitted from the battery 103 to the electronic device 102. Hereafter, the dynamic identification number from the battery 103 is compared to one or more dynamic identification numbers stored in the electronic device 102. If the dynamic identification number of the battery does not correspond to a dynamic identification number from the electronic device 102, it means that the battery has been used by other equipment or it may be a completely brand new battery. Therefore, the electronic device 102 does not have current information about the status of the battery, and the electronic device will retrieve information from the battery 102, e.g. information about the presently remaining capacity of the battery 102. If, on the other hand, the dynamic identification number of the battery corresponds to a dynamic identification number from the electronic device 102, the battery has not been used by other equipment, and the electronic device may use information on the battery stored in the electronic device instead of information retrieved from the battery. Whether the information from the electronic device 102 or information from the battery 103 is used depends on other information stored in the battery 103, e.g. information indicating if the battery has been recharged since being disconnected from the electronic device. If this is the case, the mobile phone retrieves the battery capacity from the battery. If this is not the case, the mobile phone uses previously stored internal information on the battery capacity instead. The reason why it is of interest to use internally stored information instead of information from the battery is that the electronic device is normally able to store the information with a higher resolution because of the greater available memory.

It is noted that the electronic device may be a mobile phone or a battery charger. For example, both a mobile phone and a battery charger may perform the above-mentioned reading and writing of dynamic identification numbers and on this basis decide whether to use previously stored information about the battery 103 or alternatively retrieve the information from the battery 103.

Error handling is essentially based upon an echoing mechanism used for commands and data, i.e. retransmission in relation to commands and data. Referring to FIG. 4, the first byte 401 may be transmitted by the electronic device 102 to the battery 103. When the byte 401 is received by the battery 103, the byte is re-transmitted as the byte 402 from the battery 103 to the electronic device 102. When the byte 402 is received in the electronic device 102, the byte 402 is compared with the byte 401 originally sent. If the bytes 401 and 402 do not coincide an error is detected.

In relation to write commands, re-transmission can be carried out in the following way. Firstly, the byte 401 sent by the electronic device 102 is received by the battery 103. Secondly, the received byte is written into a non-volatile memory 116 of the battery 103. Thirdly, the byte is read from the battery non-volatile memory. And finally, the read byte is retransmitted from the battery 103 to the electronic device 102 and the error detection can be performed. Thus it is also checked that the byte was correctly written into the memory 116.

Note, the above mentioned error detection can also be performed on bytes transmitted from the battery 103 to the electronic device 102.

Although a preferred embodiment of the present invention has been described and shown, the invention is not restricted to it, but may also be embodied in other ways within the scope of the subject-matter defined in the following claims.

What is claimed is:

1. A method enabling digital, serial communication over an interface between an electronic device (102) and a battery (103) attached thereto, said digital, serial communication comprising transmission of bytes (300) consisting of a number of bits, characterized in that the method comprises the steps of transmitting a byte from a first one of said electronic device and said battery, receiving said byte in the other of said electronic device and said battery, and retransmitting said received byte unchanged.

2. A method according to claim 1, characterized in that the step of retransmitting further comprises the steps of receiving a byte from said interface, storing the received byte in a non-volatile memory (116), retrieving the stored byte from said non-volatile memory, and transmitting the retrieved byte via said interface.

3. A method according to claim 1 or 2, characterized in that it further comprises the steps of receiving the retransmitted byte in the first one of said electronic device and said battery, comparing the contents of the received retransmitted byte to the contents of the byte that was previously transmitted, detecting a transmission error, if the contents of the two bytes do not coincide.

4. An apparatus comprising an electronic device (102), a battery (103) attached thereto, and means enabling digital, serial communications over an interface between the electronic device (102) and the battery (103), and comprising first communications circuitry (108) in the electronic device and second communications circuitry (117) in the battery, said digital, serial communication comprising transmission between said first and second communications circuitry of bytes (300) consisting of a number of bits, characterized in that at least one of said first and second communications circuitry is adapted to retransmit a received byte unchanged.

5. An apparatus according to claim 4, characterized in that the at least one of said first and second communications circuitry comprises a non-volatile memory (116), means for receiving a byte from said interface, means for storing the received byte in the non-volatile memory, means for retrieving the stored byte from said non-volatile memory, and means for transmitting the retrieved byte via said interface.

6. An apparatus according to claim 4 or 5, characterized in that at least one of said first and second communications circuitry comprises means for comparing the contents of a received retransmitted byte to the contents of a previously transmitted byte, means for detecting a transmission error, if the contents of the two bytes do not coincide.

7. An apparatus according to claims 4–6, characterized in that the electronic device is a cellular telephone.

8. A battery comprising means enabling digital, serial communication over an interface between the battery and an electronic device, and comprising communications circuitry (117) in the battery, said digital, serial communication comprising transmission between said communications circuitry and the electronic device of bytes consisting of a number of bits, characterized in that said communications circuitry is adapted to retransmit a received byte unchanged.

9. A battery according to claim 8, characterized in that said communications circuitry comprises a non-volatile memory (116), means for receiving a byte from said interface, means for storing the received byte in the non-volatile memory, means for retrieving the stored byte from said non-volatile memory, and means for transmitting the retrieved byte via said interface.

10. A battery according to claim 8 or 9, characterized in that said communications circuitry comprises means for comparing the contents of a received retransmitted byte with the contents of a previously transmitted byte, means for detecting a transmission error, if the contents of the two bytes do not coincide.

* * * * *